United States Patent
Toncich et al.

(10) Patent No.: US 7,164,329 B2
(45) Date of Patent: Jan. 16, 2007

(54) TUNABLE PHASE SHIFER WITH A CONTROL SIGNAL GENERATOR RESPONSIVE TO DC OFFSET IN A MIXED SIGNAL

(75) Inventors: Stanley S. Toncich, San Diego, CA (US); Raymond Curtis Wallace, San Diego, CA (US)

(73) Assignee: Kyocera Wireless Corp., San Diego, CA (US)

( * ) Notice: Subject to any disclaimer, the term of this patent is extended or adjusted under 35 U.S.C. 154(b) by 288 days.

(21) Appl. No.: 10/120,938

(22) Filed: Apr. 10, 2002

(65) Prior Publication Data

US 2003/0194984 A1 Oct. 16, 2003
US 2005/0043001 A9 Feb. 24, 2005

Related U.S. Application Data

(63) Continuation-in-part of application No. 09/927,732, filed on Aug. 8, 2001, now Pat. No. 6,690,176, and a continuation-in-part of application No. 09/904,631, filed on Jul. 13, 2001, now abandoned.

(60) Provisional application No. 60/283,093, filed on Apr. 11, 2001.

(51) Int. Cl.
*H01P 1/18* (2006.01)
(52) U.S. Cl. ..................... 333/139; 333/156; 455/318; 455/319
(58) Field of Classification Search ................ 455/283, 455/296, 323, 324, 313, 318, 319; 327/231, 327/233, 234; 333/156, 161, 164, 138, 139
See application file for complete search history.

(56) References Cited

U.S. PATENT DOCUMENTS

| | | | |
|---|---|---|---|
| 3,239,838 | A | 3/1966 | Kelleher |
| 3,413,543 | A | 11/1968 | Schubring et al. |
| 3,569,795 | A | 3/1971 | Gikow |
| 3,676,803 | A | 7/1972 | Simmons |
| 3,678,305 | A | 7/1972 | Paige |
| 3,680,135 | A | 7/1972 | Boyer |
| 3,737,814 | A | 6/1973 | Pond |
| 3,739,299 | A | 6/1973 | Adler |
| 3,836,874 | A | 9/1974 | Maeda et al. |
| 3,918,012 | A | 11/1975 | Peuzin |

(Continued)

FOREIGN PATENT DOCUMENTS

DE 40 36 866 A1 7/1991

(Continued)

OTHER PUBLICATIONS

A. Presser, "Varactor-Tunable, High-Q Microwave Filter," RCA Review, vol. 42, Dec. 1981, pp. 691-705.

(Continued)

*Primary Examiner*—Benny Lee

(57) ABSTRACT

The present invention provides a phase shifting filter and a phase compensating direct downconversion receiver. A DC offset detector detects a DC offset in a received baseband signal and provides a feedback signal. A tunable filter phase shifts a local oscillator signal responsive to the feedback signal. The phase-shifted local oscillator signal is used to directly downconvert a received RF signal, whereby DC offset in the resulting baseband signal is reduced.

12 Claims, 4 Drawing Sheets

U.S. PATENT DOCUMENTS

| | | | |
|---|---|---|---|
| 4,122,400 A | 10/1978 | Medendorp et al. | |
| 4,236,125 A | 11/1980 | Bernard et al. | |
| 4,475,108 A | 10/1984 | Moser | |
| 4,484,157 A | 11/1984 | Helle et al. | |
| 4,494,081 A | 1/1985 | Lea et al. | |
| 4,525,720 A | 6/1985 | Corzine et al. | |
| 4,626,800 A | 12/1986 | Murakami et al. | |
| 4,733,328 A | 3/1988 | Blazej | |
| 4,736,169 A | 4/1988 | Weaver et al. | |
| 4,737,797 A | 4/1988 | Siwiak et al. | |
| 4,746,925 A | 5/1988 | Toriyama | |
| 4,792,939 A | 12/1988 | Hikita et al. | |
| 4,799,066 A | 1/1989 | Deacon | |
| 4,835,499 A | 5/1989 | Pickett | |
| 4,835,540 A | 5/1989 | Haruyama et al. | |
| 4,847,626 A | 7/1989 | Kahler et al. | |
| 4,975,604 A | 12/1990 | Barta | |
| 5,166,857 A | 11/1992 | Avanic et al. | |
| 5,173,709 A | 12/1992 | Lauro et al. | |
| 5,212,463 A | 5/1993 | Babbitt et al. | |
| 5,216,392 A | 6/1993 | Fraser et al. | |
| 5,227,748 A | 7/1993 | Sroka | |
| 5,231,407 A | 7/1993 | McGirr et al. | |
| 5,293,408 A | 3/1994 | Takahashi et al. | |
| 5,307,033 A | 4/1994 | Koscica et al. | |
| 5,325,099 A | 6/1994 | Nemit et al. | |
| 5,388,021 A | 2/1995 | Stahl | |
| 5,406,163 A | 4/1995 | Carson et al. | |
| 5,416,803 A | 5/1995 | Janer | |
| 5,427,988 A | 6/1995 | Sengupta et al. | |
| 5,450,092 A | 9/1995 | Das | |
| 5,451,915 A | 9/1995 | Katzin et al. | |
| 5,459,123 A | 10/1995 | Das | |
| 5,472,935 A | 12/1995 | Yandrofski et al. | |
| 5,479,139 A | 12/1995 | Koscica et al. | |
| 5,495,215 A | 2/1996 | Newell et al. | |
| 5,496,795 A | 3/1996 | Das | |
| 5,496,796 A | 3/1996 | Das | |
| 5,502,422 A | 3/1996 | Newell et al. | |
| 5,525,942 A | 6/1996 | Horii et al. | |
| 5,557,286 A | 9/1996 | Varadan | |
| 5,561,307 A | 10/1996 | Mihara et al. | |
| 5,561,407 A | 10/1996 | Koscica et al. | |
| 5,564,086 A | 10/1996 | Cygan et al. | |
| 5,574,410 A | 11/1996 | Collins et al. | |
| 5,577,025 A | 11/1996 | Skinner | |
| 5,583,524 A | 12/1996 | Milroy | |
| 5,589,845 A | 12/1996 | Yandrofski et al. | |
| 5,600,279 A | 2/1997 | Mori | |
| 5,617,104 A | 4/1997 | Das | |
| 5,640,042 A | 6/1997 | Koscica et al. | |
| 5,649,306 A | 7/1997 | Vanatta et al. | |
| 5,652,599 A | 7/1997 | Pitta et al. | |
| 5,673,188 A | 9/1997 | Lusher et al. | |
| 5,701,595 A | 12/1997 | Green, Jr. | |
| 5,721,194 A | 2/1998 | Yandrofski et al. | |
| 5,729,239 A | 3/1998 | Rao | |
| 5,777,524 A | 7/1998 | Wojewoda et al. | |
| 5,777,839 A | 7/1998 | Sameshina et al. | |
| 5,778,308 A | 7/1998 | Sroka et al. | |
| 5,830,591 A | 11/1998 | Sengupta et al. | |
| 5,834,975 A | 11/1998 | Bartlett et al. | |
| 5,864,932 A | 2/1999 | Evans et al. | |
| 5,870,670 A * | 2/1999 | Ripley et al. ............... 455/304 | |
| 5,880,921 A | 3/1999 | Tham et al. | |
| 5,892,486 A | 4/1999 | Cook et al. | |
| 5,908,811 A | 6/1999 | Das | |
| 5,945,887 A | 8/1999 | Makino et al. | |
| 5,965,494 A | 10/1999 | Terashima et al. | |
| 5,973,567 A | 10/1999 | Heal et al. | |
| 5,973,568 A | 10/1999 | Shapiro et al. | |
| 5,986,515 A | 11/1999 | Sakurai | |
| 5,987,314 A | 11/1999 | Saito | |
| 5,990,766 A | 11/1999 | Zhang | |
| 6,008,659 A | 12/1999 | Traynor | |
| 6,018,282 A | 1/2000 | Tsuda | |
| 6,020,787 A | 2/2000 | Kim et al. | |
| 6,026,311 A | 2/2000 | Willemsen Cortes et al. | |
| 6,028,561 A | 2/2000 | Takei | |
| 6,049,726 A | 4/2000 | Gruenwald et al. | |
| 6,052,036 A | 4/2000 | Enstrom et al. | |
| 6,054,908 A | 4/2000 | Jackson | |
| 6,094,588 A | 7/2000 | Adam | |
| 6,097,263 A | 8/2000 | Mueller et al. | |
| 6,101,102 A | 8/2000 | Brand et al. | |
| 6,108,191 A | 8/2000 | Bruchhaus et al. | |
| 6,160,524 A | 12/2000 | Wilber | |
| 6,181,777 B1 | 1/2001 | Kiko | |
| 6,198,441 B1 | 3/2001 | Okabe et al. | |
| 6,216,020 B1 | 4/2001 | Findikoglu | |
| 6,242,843 B1 | 6/2001 | Pohjonen et al. | |
| 6,272,336 B1 | 8/2001 | Appel et al. | |
| 6,278,383 B1 | 8/2001 | Endo et al. | |
| 6,281,023 B1 | 8/2001 | Eastep et al. | |
| 6,281,534 B1 | 8/2001 | Arita et al. | |
| 6,285,337 B1 | 9/2001 | West et al. | |
| 6,292,143 B1 | 9/2001 | Romanofsky | |
| 6,294,964 B1 | 9/2001 | Satoh | |
| 6,308,051 B1 | 10/2001 | Atokawa | |
| 6,327,463 B1 | 12/2001 | Welland | |
| 6,329,959 B1 | 12/2001 | Varadan et al. | |
| 6,333,719 B1 | 12/2001 | Varadan | |
| 6,335,710 B1 | 1/2002 | Falk et al. | |
| 6,344,823 B1 | 2/2002 | Deng | |
| 6,359,444 B1 | 3/2002 | Grimes | |
| 6,362,784 B1 | 3/2002 | Kane et al. | |
| 6,362,789 B1 | 3/2002 | Trumbull et al. | |
| 6,384,785 B1 | 5/2002 | Kamogawa et al. | |
| 6,404,304 B1 | 6/2002 | Kwon et al. | |
| 6,456,236 B1 | 9/2002 | Hauck et al. | |
| 6,462,628 B1 | 10/2002 | Kondo et al. | |
| 6,489,860 B1 | 12/2002 | Ohashi | |
| 6,503,786 B1 | 1/2003 | Klodzinski | |
| 6,518,850 B1 | 2/2003 | Falk et al. | |
| 6,518,920 B1 | 2/2003 | Proctor, Jr. et al. | |
| 6,522,220 B1 | 2/2003 | Yamada et al. | |
| 6,525,630 B1 | 2/2003 | Zhu et al. | |
| 6,525,691 B1 | 2/2003 | Varadan et al. | |
| 6,531,936 B1 * | 3/2003 | Chiu et al. ................. 333/164 | |
| 6,559,737 B1 * | 5/2003 | Nagra et al. ................. 333/156 | |
| 6,571,110 B1 | 5/2003 | Patton et al. | |
| 6,600,456 B1 | 7/2003 | Gothard et al. | |
| 6,653,977 B1 | 11/2003 | Okabe et al. | |
| 6,667,723 B1 | 12/2003 | Forrester | |
| 6,686,817 B1 | 2/2004 | Zhu et al. | |
| 6,721,293 B1 | 4/2004 | Komulainen et al. | |
| 6,727,535 B1 | 4/2004 | Sengupta et al. | |
| 2001/0026243 A1 | 10/2001 | Koitsalu et al. | |
| 2001/0043159 A1 | 11/2001 | Masuda et al. | |
| 2002/0049064 A1 | 4/2002 | Banno | |
| 2002/0149526 A1 | 10/2002 | Tran et al. | |
| 2002/0149535 A1 | 10/2002 | Toncich | |
| 2002/0175878 A1 | 11/2002 | Toncich | |
| 2003/0062971 A1 | 4/2003 | Toncich | |
| 2003/0134665 A1 | 7/2003 | Kato et al. | |
| 2004/0196121 A1 | 10/2004 | Toncich | |
| 2004/0263411 A1 | 12/2004 | Fabrega-Sanchez et al. | |
| 2005/0007291 A1 | 1/2005 | Fabrega-Sanchez et al. | |

FOREIGN PATENT DOCUMENTS

| | | |
|---|---|---|
| DE | 100 24 483 | 11/2001 |
| DE | 101 37 753 | 2/2003 |
| EP | 0 125 586 | 11/1984 |

| | | |
|---|---|---|
| EP | 0 346 089 | 12/1989 |
| EP | 0 473 373 | 3/1992 |
| EP | 0 531 125 | 3/1993 |
| EP | 0 631 399 | 12/1994 |
| EP | 0 637 131 A1 | 2/1995 |
| EP | 0 638 953 A1 | 2/1995 |
| EP | 0 680 108 A1 | 4/1995 |
| EP | 0 795 922 A1 | 9/1997 |
| EP | 0 843 374 A2 | 5/1998 |
| EP | 0 881 700 A1 | 5/1998 |
| EP | 0 854 567 | 7/1998 |
| EP | 0 872 953 | 10/1998 |
| EP | 0 892 459 | 1/1999 |
| EP | 0 909 024 A2 | 4/1999 |
| EP | 1 043 741 A2 | 10/2000 |
| EP | 1 058 333 | 12/2000 |
| EP | 1 248 317 | 10/2002 |
| GB | 2 240 227 | 7/1991 |
| JP | 63 128618 | 6/1988 |
| JP | 05182857 | 7/1993 |
| JP | 2001338839 | 12/2001 |
| WO | WO 82/03510 | 10/1982 |
| WO | WO 94/13028 | 6/1994 |
| WO | WO 94/27376 | 11/1994 |
| WO | WO 00/28613 | 5/2000 |
| WO | WO 00/35042 | 6/2000 |
| WO | WO 00/62367 | 10/2000 |
| WO | WO 00/79645 A1 | 12/2000 |
| WO | WO 00/79648 A1 | 12/2000 |
| WO | WO 03/058759 | 7/2001 |
| WO | WO 02/084798 | 10/2002 |

OTHER PUBLICATIONS

C. Chang and T. Itoh, "Microwave Active Filters Based on Coupled Negative Resistance Method," IEEE Transactions on Microwave Theory and Techniques, vol. 38, No. 12, Dec. 1990, pp. 1879-1884.

P. Katzin, B. Bedard, Y. Ayasli, "Narrow-Band MMIC Filters with Automatic Tuning and Q-Factor Control," 1993 IEEE MTT-S Digest pp. 403-406.

B. Hopf, I. Wolff, M.Guglielmi, "Coplanar MMIC Active Bandpass Filters Using Negatlive Resistance Circuits," 1994 IEEE MTT-S Digest pp. 1183-1185.

U. Karacaoglu and I. D. Robertson, "High Selectivity Varactor-Tuned MMIC Bandpass Filter Using Lossless Active Resonators," 1994 IEEE MTT-S Digest, pp. 1191-1194.

B. Nauta, "A CMOS Transconductance-C Filter Technique for Very High Frequencies," IEEE Journal of Solid-State Circuits, vol. 27, No. 2, Feb. 1992, pp. 142-153.

K. Fujita, H. Itoh, R. Yamamoto, "A 15.6 GHz Commercially Based 1/8 GaAs Dynamic Prescaler," 1989 IEEE GaAs IC Symposium, pp. 113-116.

J. Smuk, P. Katzin, "MMIC Phase Locked L-S Band Oscillators," 1994 GaAs IC Symposium Digest, pp. 27-29.

S. R. Chandler, I. C. Hunter, J. G. Gardiner, "Active Varactor Tunable Bandpass Filter," IEEE Microwave and Guided Wave Letters, vol. 3, No. 3, Mar. 1993.

I. C. Hunter, J. D. Rhodes, "Electronically Tunable Microwave Bandpass Filters," IEEE Transactions on Microwave Theory and Techniques, vol. MTT-30, No. 9, Sep. 1982, pp. 1354-1367.

S. Toyoda, "Quarter-Wavelength Coupled Variable Bandstop and Bandpass Filter Using Varactor Diodes," IEEE Transactions on Microwave Theory and Techniques, vol. MTT-30, No. 9, Sep. 1982, pp. 1387-1389.

B. Yu.Kapilevich, "Variety of Approaches to Designing Microwave Active Filters," Proc. 27th European Microwave Conf., Jerusalem, vol. 1, 1997, pp. 397-408.

B. Kapilevich, "Understand the Operation of Channelized Active Filters," Microwaves & RF, Jan. 1997, pp. 89-92.

M. Dishall, "Alignment and Adjustment of Synchronously Tuned Multiple-Resonant-Circuit Filters," Proceedings of the IRE 39, Nov. 1951, pp. 1448-1455.

S. Cohn, "Dissipation Loss in Multiple-Coupled-Resonator Filters," Proceedings of the IRE 47, Aug. 1959, pp. 1342-1348.

G. L. Matthaei, "An Electronically Tunable Up-Convertor," Proceedings of the IRE 49, Nov. 1961, pp. 1703-1704.

E. G. Fubini, E. A. Guillemin, "Minimum Insertion Loss Filters," Proceedings of the IRE 47, Jan. 1959, pp. 37-41.

W. J. Getsinger, "Prototypes for Use in Broadbanding Reflection Amplifiers," IEEE Transactions on Microwave Theory and Techniques, PTGMTT-11, Nov. 1963, pp. 486-497.

E. S. Kuh, M. Fukada, "Optimum Synthesis of Wide-Band Parametric Amplifiers and Converters," IRE Transactions on Circuit Theory, PCCT-8, Dec. 1961, pp. 410-415.

W. J. Getsinger, G. L. Matthaei, "Some Aspects of the Design of Wide-Band Up-Converters and Nondegenerate Parametric Amplifiers," IEEE Transactions on Microwave Theory and Techniques, PTGMTT-12, Jan. 1964, pp. 77-87.

R. L. Sleven, "Design of a Tunable Multi-Cavity Waveguide Band-Pass Filter," 1959 IRE National Convention Record, Part 3, pp. 91-112.

J. J. Taub, B. F. Bodner, "Design of Three-Resonator Dissipative Band-Pass Filters Having Minimum Insertion Loss," Proceedings of the IRE 45, May 1957, pp. 681-687.

K. L. Kotzebue, "Broadband Electronically-Tuned Microwave Filters," 1960 IRE Wescon Convention Record, Part 1, pp. 21-27.

J. P. Louhos, I. Pankinaho, "Electrical Tuning of Integrated Mobile Phone Antennas," Nokia Mobile Phones, Sep. 15, 1999, pp. 69-97.

P. K. Panayi, M. Al-Nuaimi, L. P. Ivrissimtzis, "Tuning Techniques for the Planar Inverted-F Antenna," National Conference on Antennas and Propagation Publication, No. 461, Apr. 1999, pp. 259-262.

Satoshi Makioka et al, "A High Efficiency GaAs MCM Power Amplifier for 1.9GHz Digital Cordless Telephones," IEE 1994 Microwave and Millimeter-Wave Monolithic CIrcuits Symposium, 1994, pp. 51-54.

V. K. Varadan, K. A. Jose, V. V. Varadan, "Design and Development of Electronically Tunable Microstrip Antennas," IOP Publishing Ltd., 1999, pp. 238.242.

Communication Relating to the Results of the Partial International Search: PCT/IB 02/01077 (2002).

International Search Report: PCT/IB 02/01086 (Jun. 24, 2002).

International Search Report: PCT/IB 02/01078 (Jul. 10, 2002).

International Search Report: PCT/IB01087 (Jul. 19, 2002).

International Search Report: PCT/IB 02/01107 (Jul. 11, 2002).

International Search Report: PCT/IB 02/01120 (Jul. 11, 2002).

International Search Report: PCT/IB 02/01098 (Jul. 4, 2002).

International Search Report: PCT/IB 02/01082 (Jul. 8, 2002).

International Search Report: PCT/IB 02/01144 (Jul. 12, 2002).

International Search Report: PCT/IB 02/01026 (Jun. 28, 2002).

International Search Report: PCT/IB 02/01027 (Jun. 25, 2002).

Cuthbert, T., "Broadband Impedance Matching -Fast and Simple", RF Design, Cardiff Publishing Co., vol. 17, No. 12, Nov. 1994, pp. 38, 42, 44, 48, XP000477834.

Erker et al., "Monolithic Ka-Band Phase Shifter Using Voltage Tunable BaSrTiO3 Parallel Plate Capacitors", IEEE Microwave and Guided Wave Letters, IEEE Inc., vol. 10, No. 1, Jan. 2000, pp. 10-12 XP-000930368.

Galt, D. et al., "Ferroelectric Thin Film Characterization Using Superconducting Microstrip Resonators", IEEE Trans on Appl Superconductivity Jun. 1995 IEEE, pp. 2575-2578, vol. 5, No. 2, Piscataway, NJ, USA.

Gevorgian, Spartak S. et al., "HTS/Ferroelectric Devices for Microwave Applications", IEEE Transactions on Applied Superconductivity, Jun. 1997, pp. 2458-2461, IEEE, USA.

Jose et al., "Experimental investigations on electronically tunable microstrip antennas," Feb. 5, 1999, Microwave and optical technology letters, vol. 20, No. 3, pp. 166-169.

Keis, V. N. et al., "20GHz tunable filter based on ferroelectric (BaSr)TiO3 film varactors", Electronics Letters, May 28, 1998, vol. 34, No. 11, IEE Stevenage, GB.

Kozyrev, A., et al., "Ferroelectric Films: Nonlinear Properties and Applications in Microwave Devices", 1998 IEEE MTT-S Digest, May 1998, pp. 985-988, 1998 IEEE MTT-S Intl Baltimore, MD, USA, IEEE, USA.

Krautkramer, V.W. et al., "Resonanztransformatoren mit drei Reaktanzen als transformierende Filter", Bulletin des Schweizerischen Elektrotechnischen Vereins, Zurich, CH, vol. 64, No. 23, Nov. 10, 1973, pp. 1500-1509, XP002184530.

Toncich et al., "Data Reduction Method for Q Measurements of Stripline Resonators", IEEE Transactions in MTT, vol. 40, No. 9, Sep. 1992, pp. 1833-1836.

Vendik, O.G. et al., "1GHz tunable resonator on bulk single crystal $SrTiO_3$ plated with $Yba_2Cu_3O_{7-x}$ films", Electronics Letters, Apr. 13, 1995, pp. 654-656, vol. 31, No. 8, IEE Stevenage, GB.

* cited by examiner

PRIOR ART DIRECT DOWNCONVERSION RECEIVER

DIRECT DOWNCONVERSION RECEIVER

TUNABLE PHASE SHIFER WITH A CONTROL SIGNAL GENERATOR RESPONSIVE TO DC OFFSET IN A MIXED SIGNAL

RELATED APPLICATIONS

This is a continuation-in-part of U.S. Application Ser. No. 09/927,732, filed Aug. 8, 2001 now U.S. Pat. No. 6,690,176, and is a continuation-in-part of U.S. application Ser. No. 09/904,631 filed Jul. 13, 2001 now U.S. Pat. No. 6,690,251 and claims the benefit U.S. Provisional Application No. 60/283,093, filed Apr. 11, 2001and of U.S. application Ser. No. 09/927,732 filed Aug. 8, 2001 which claims the benefit of Provisional application 60/283,093 filed Apr. 11, 2001.

BACKGROUND

1. Field of the Invention

The field of the present invention is electronics. More particularly, the present invention relates to direct conversion receivers in wireless communication devices.

2. Description of Related Art

Most present wireless communication devices use transceivers (transmitters and receivers) that have an intermediate frequency (IF) stage between the baseband and the radio frequency (RF) stages. Transceivers with an IF stage are called superheterodyne transceivers. The compelling commercial drive for cheaper, more reliable, longer lasting and smaller wireless communication devices is causing many in the industry to attempt to eliminate the IF stage. This would produce a saving in number of components, cost and size.

Transceivers without IF stages are called direct down conversion transceivers, since the RF signal is converted directly to a baseband signal from the RF signal. They are also known as zero IF transceivers.

Since a superheterodyne receiver does have an intermediate frequency stage, a superheterodyne receiver will generally have more components compared to a direct down-conversion receiver. Currently, most wireless handsets are made with superheterodyne transceivers (transmitter and receiver) since the use and manufacture of superheterodyne receivers is well understood. Although most handsets use a superheterodyne design, such use is in tension with the ever-present concern of reducing the size of handsets and lowering their cost of manufacture because of the hardware needed for the intermediate frequency stage.

The use of direct-conversion technology in wireless handsets would obviate the need for an intermediate frequency stage, thereby reducing manufacturing cost and size limitations. However, a number of problems have prevented the widespread use of direct conversion technology in wireless handsets. For example, consider FIG. 1 showing a prior art direct downconversion receiver 5. The receiver 5 includes an antenna 10 to receive a transmitted radio-frequency (RF) signal 11. RF signal 11 couples through a duplexer 12 to a low noise amplifier (LNA) 14. The amplified RF signal then couples to a mixer 15 through RF port 22. The amplified RF signal is typically a bandpass signal, $g_{bp}(t)$, that may be represented as $$g_{bp}(t) = g_c(t)\cos w_0 t + g_s(t)\sin w_0 t$$

where $g_c(t)$ and $g_s(t)$ are the in-phase (I) and quadrature (Q) components of the baseband signal, respectively. Thus, to convert this bandpass signal to its baseband components, a voltage-controlled oscillator (VCO) 16 produces a sinusoid at the RF frequency $w_0$ to couple into the mixer 15 through LO port 24. A baseband low pass filter 18 recovers the baseband components, which are then processed by an A/D and digital-signal-processor (DSP) baseband processor 20.

Note that the mixer receives sinusoids at the same frequency, $w_0$, at both its ports 22 and 24. Thus, unlike a mixer in the IF stage of a superheterodyne receiver, serious coupling side effects can occur in the mixer 15. These effects include non-linear effects of the mixer producing unwanted harmonics of the baseband signal. In addition, a DC offset may be present in the demodulated baseband signal due to leakage of the VCO's sinusoid output into RF port 22 of mixer 15. This type of leakage is particularly problematic because the VCO output is typically many decibels higher in power than the output of the low noise amplifier 15. Moreover, this type of leakage is exacerbated at the higher frequencies, such as the PCS band, used in wireless handsets.

Given an LO leakage, a sinusoid output at frequency $w_1$ from the VCO 16 entering LO port 24 will also couple into RF port 22. The same signal is thus present at both RF port 22 and LO port 24 and will be squared by mixer 15. Regardless of the phase of the input sinusoid, its squaring produces a sinusoid of double the input frequency and a DC offset term. Thus, LO leakage necessarily produces a DC offset. A number of techniques have been developed to address the problem of LO leakage and the resulting distortion and DC offset in the demodulated baseband signal. For example, U.S. Pat. Nos. 4,811,425 and 5,001,773 disclose schemes to directly cancel the LO component entering RF port 22 of mixer 15. Because the LO component entering RF port 22 is necessarily of smaller amplitude than the LO signal produced by VCO 16, a cancelling signal must be appropriately scaled and phase-shifted to cancel the leaking LO component. These direct cancellation schemes suffer from the expensive hardware necessary and poor efficiency at cancelling the leakage component.

Accordingly, there is a need in the art for improved apparatus and techniques for reducing local oscillator leakage effects in direct downconversion receivers.

SUMMARY OF THE INVENTION

It is desirable to provide a direct downconversion receiver that reduces DC offset in its demodulated baseband signal. It is therefore an object of the invention to provide a methodology for adaptively adjusting the receiver's characteristics in response to detected DC offset.

In accordance with one aspect of the invention, a tunable, low loss, phase shifting filter is provided. The filter may be configured as a low pass filter, a high pass filter or an all pass filter. The filter includes a variable dielectric constant ferroelectric component.

In accordance with another aspect of the invention, a direct downconversion receiver has a DC offset detector for detecting a DC offset in a received baseband signal and providing a negative feedback signal proportional to the detected DC offset. A tunable filter adjusts the phase of the receiver's local oscillator signal according to the negative feedback signal. A mixer mixes a received RF signal with the phase-shifted local oscillator signal to produce the baseband signal. Because of the negative feedback loop formed by the DC offset detector, tunable filter, and mixer, the amount of DC offset in the baseband signal is reduced.

In accordance with another aspect of the invention, a method is provided for reducing DC offset in a direct downconversion receiver. In this method, a received RF signal is mixed with a phase-shifted local oscillator signal to produce a directly downconverted baseband signal. A DC offset in the baseband signal is detected and the phase-shift in the phase-shifted local oscillator signal is adjusted to reduce the DC offset.

Further aspects and features of the invention are set forth in the following description together with the accompanying drawings.

BRIEF DESCRIPTION OF THE DRAWINGS

Use of the same reference symbols in different figures indicates similar or identical items.

DETAILED DESCRIPTION OF THE INVENTION

Figure 1:
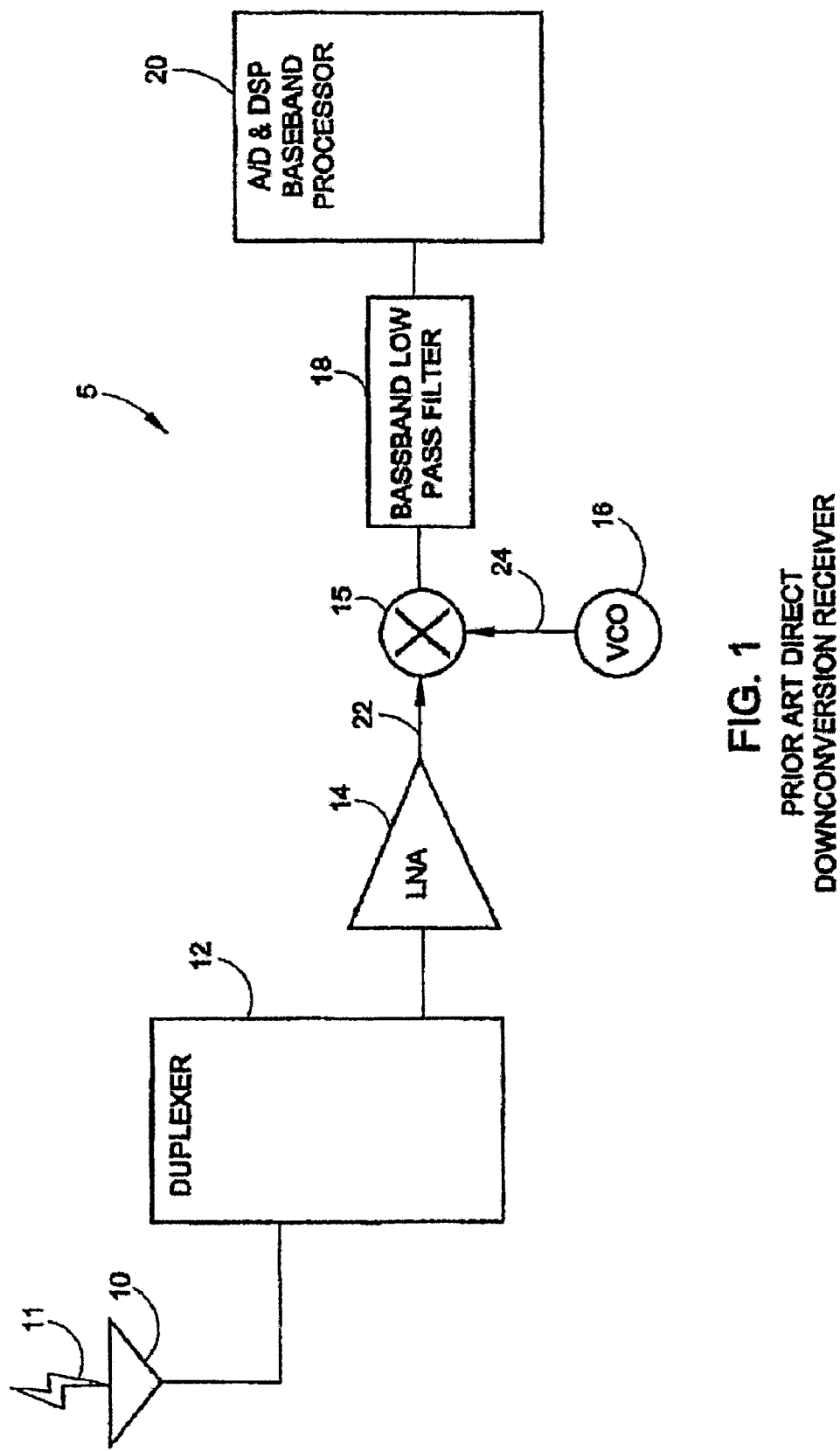
FIG. 1 is a block diagram of a prior art direct down conversion receiver.
Figure 2:
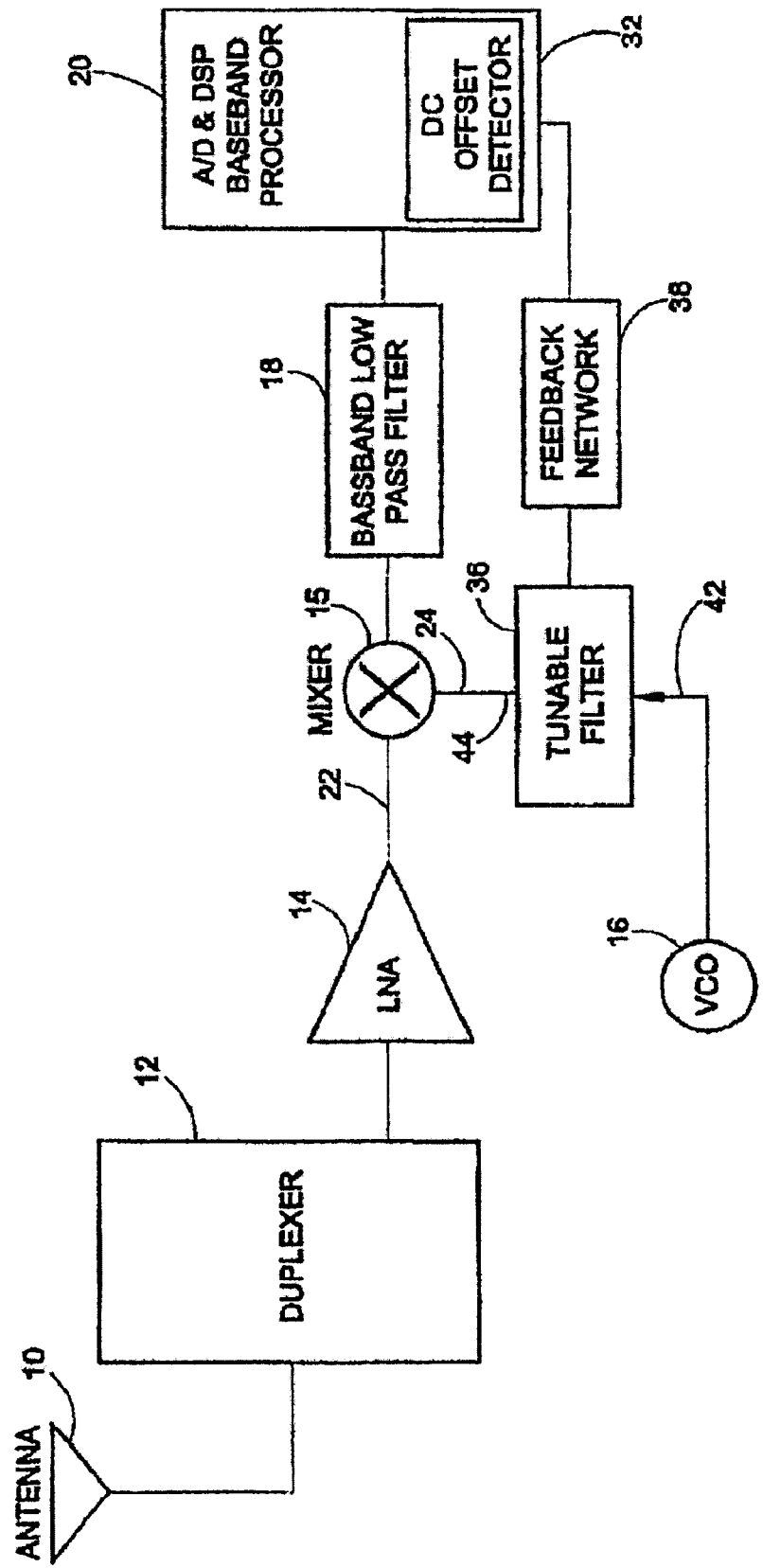
FIG. 2 is a block diagram of a direct down conversion receiver configured to provide DC offset reduction according to one embodiment of the invention.

Referring now to FIG. 2, a phase-compensated direct downconversion receiver 30 is illustrated. As discussed with respect to FIG. 1, downconversion receiver 30 may include antenna 10, duplexer 12, low noise amplifier (LNA) 14, mixer 15, VCO 16, baseband low pass filter 18, and A/D & DSP baseband processor 20. In addition, baseband processor 20 includes a DC offset detector 32. Although shown integrated with baseband processor 20, DC offset detector 32 may be distinct from baseband processor 20. It will be appreciated that DC offset detector 32 may be implemented in hardware or software or a combination of the two in a number of ways.

Regardless of the implementation, DC offset detector 32 functions to provide a measure of the amount of DC offset present in the demodulated baseband signal recovered by baseband processor 20. For example, DC offset detector 32 could average or low pass filter the waveform produced by the analog-to-digital converter (A/D) within baseband processor 20. DC offset detector 32 could then be implemented in a microprocessor or state machine programmed to keep a running average of the A/D converter's waveform. If there is no DC offset, the average of this waveform should be approximately zero in that, over time, the positive samples would tend to cancel the negative samples produced in the digitized waveform coming from the A/D converter. The DC offset would tend to bias the signal high or low. Feedback network 38 would receive the digital DC offset measurement from DC offset detector 32. Based on this value, feedback network 38 incrementally adjusts the value of $V_{f-e}$ applied to tunable filter 36. Feedback network 38 retains a memory of the value of DC offset measurement. If the next measurement of DC offset received by feedback network 38 from DC offset detector 32 is larger in magnitude than the preceding value, feedback network 38 reverses directions and sets the value of $V_{f-e}$ to a value on the opposite side of the initial value of $V_{f-e}$. If, however, the next measurement of DC offset received by feedback network 38 from DC offset detector 32 is smaller in magnitude than the preceding value, feedback network 38 maintains the direction of change in $V_{f-e}$ and increments $V_{f-e}$ again.

Alternatively, one could design the system to initially operate without an RF input to detect the DC offset preset. This DC offset could be subtracted out. This will work if the time variation of the DC offset is quite small Relative to the sampling period of the DC offset detector and the feedback network. Alternatively, DC offset detector 32 would simply be provided by signal quality metrics already provided in a conventional receiver such as a wireless handset. For example, SINAD which is the ratio of the demodulated baseband signal strength to all noise and interfering signals could be used. As SINAD dipped below a pre-determined threshold, DC offset could be presumed to be present.

Regardless of how the DC offset is detected by DC offset detector 32, DC offset detector 32 will generate a feedback signal proportional to the amount of DC offset. This feedback signal may be either analog or digital. For example, if DC offset detector 32 is a microprocessor performing a running average of the digitized waveform produced by baseband processor's A/D converter, DC offset detector could just scale the running average into an appropriate digitized value. The amount of scaling appropriate will be determined by consideration of the characteristics of a tunable filter 36 that couples to the feedback signal through a feedback network 38. Tunable filter 36 may be an all-pass, a low pass or a high-pass filter that adjusts the phase of the local oscillator signal produced by VCO 16. Tunable filter 36 adjusts the phase responsive to the feedback signal coupled through negative feedback network 38. Ass stated above, tunable filter 36 could even be a low pass filter, should its corner frequency be high enough with respect to the frequency of the local oscillator signal. Because the local oscillator signal produced by VCO 16 is normally a narrowband sinusoid, the type of tunable filter 36, whether all-pass, high-pass, or even low-pass, is not important so long as the local oscillator signal will pass through tunable filter 36 with enough amplitude to function in mixer 15 to downconvert the amplified received RF signal entering the mixer's RF port 22.

A key advantage of the present invention is that the amplitude of the signal produced by tunable filter 36 is not important. In other words, unlike the prior art DC offset reduction schemes discussed previously, direct downconversion receiver 30 need only control the phase of local oscillator signal with respect to feedback from DC offset detector 32. In contrast, because the previously-discussed prior art schemes served to directly cancel the LO leakage entering RF port 22, these schemes had to adjust both the phase and amplitude of the LO leakage cancelling signal. The difficulty of matching both these signal characteristics leads to the poor DC offset cancellation efficiency of such schemes.

Tunable filter 36, responsive to the presence of a DC offset feedback signal produced by negative feedback network 38, adjusts the phase of the local oscillator signal produced by VCO 16. It will be appreciated that many different types of tunable filters 36 may be implemented that will suitably adjust the phase of the local oscillator signal. Importantly, however, the tunable filter 36 will be near LO port 24 of mixer 15. Filter 36 should be near LO port 24, in order to reduce the length of the transmission line, thus reducing the LO leakage that can leak into port 22. Note that VCO 16 will typically provide a local oscillator signal not just to mixer 15 but will couple the LO signal to multiple locations throughout receiver 30. For example, in a wireless handset, VCO 16 may be several inches away from mixer 15 and the local oscillator signal distributed on several traces or leads on the wireless handset's motherboard. In this fashion, the local oscillator signal may radiate from the inch or greater in length lead from VCO 16 to mixer 15 as well as the other leads carrying the local oscillator signal. This gives ample opportunity for the local oscillator signal to reactively couple or radiate into RF port 22 of mixer 15. Such reactive coupling and radiation is facilitated by the relatively high (1–2 GHz) frequencies employed in modern digital handsets. In contrast, however, tunable filter 36 is preferably as close as possible to mixer 15 so as to minimize any reactive coupling of the phase-adjusted local oscillator signal produced by tunable filter 36 into RF port 22 of mixer 15. This is important because the phase-shifted local oscillator signal produced by tunable filter 36 cannot cancel itself—should it reactively couple into RF port 22 of mixer 15, it will be mixed with itself. As discussed previously, the resulting squaring of a sinusoid, in this case the phase-shifted local oscillator signal, will produce a DC offset term. Locating tunable filter 36 adjacent LO port 24 of mixer 15 will minimize this squaring of its phase-shifted output signal in mixer 15, thereby preventing an undesired DC offset in the demodulated baseband signal produced by baseband processor 20.

The phase-shifted local oscillator signal from tunable filter 36 will be mixed or multiplied with the amplified received RF signal and any LO leakage signal resulting from reactive coupling or radiation of the local oscillator signal into RF port 22. Because of the multiplication, tunable filter's phase-shifted output can cancel the LO leakage signal regardless of the phase-shifted local oscillator signal's amplitude. As will be appreciated by those of ordinary skill in the art, many types of tunable filter architectures may be implemented in the present invention.

Figure 3:
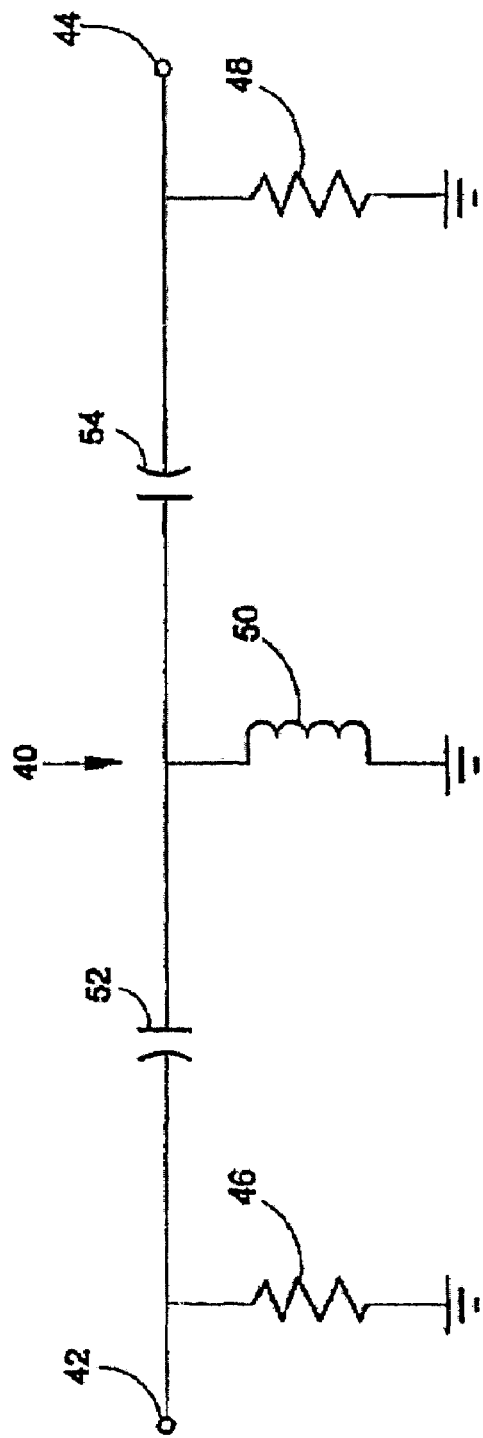
FIG. 3 illustrates a tunable high pass filter suitable for use in the direct downconversion receiver of FIG. 2.

FIG. 3 illustrates a high pass tunable filter 40 tuned to 2.0 GHz that will phase shift a local oscillator signal as one embodiment of tunable filter 36. As is customary in the art, the input 42 and output 44 of tunable filter 40 are matched to a 50 Ω impedance as symbolized by resistors 46 and 48. Of course, it will be appreciated that this assumes LO input port 24 and VCO 16 are tuned to have matching 50 Ω impedances as shown in FIG. 2. Regardless of the actual impedance involved, the components should be adjusted for matching output and input impedances for maximum efficiency. Any impedance elements can be used. An impedance element is defined herein as any element having an impedance, such as, for example, a capacitor, an inductor, a resistor, a transmission line, etc.

Inductor 50 may have an inductance of 4.0 nH. The tunable elements are capacitors 52 and 54. In this embodiment, capacitors 52 and 54 are identical and may be tuned over a range of 1 to 4 pF in capacitance. Because of the resulting symmetry, ports 42 and 44 are equivalent and may be denoted as either input or output ports.

Many different tunable elements may be used to form capacitors 52 and 54, such as varactor diodes, MEMs capacitors, or movable parallel plates. Alternatively, ferroelectric (f-e) material may be used to form capacitors 52 and 54 in a variety of topologies such as gap, overlay, or interdigital. The principle advantage of using f-e capacitors in the range of 1 to 2 GHz is that they can provide lower loss than other tunable components, such as, for example, varactor diodes. Any phase shifting network used in such an application should preferably provide the lowest possible RF loss. System performance is degraded when the local oscillator (LO) drive level is reduced. Furthermore, many mixers require a minimum LO drive level to satisfy mixer gain and loss requirements, depending on whether the mixer is active or passive. Added loss in the LO path requires an increased LO drive level, thus increasing current draw in the battery as well as providing a higher level signal to leak into the RF path.

Further details of designing a suitable tunable f-e capacitor may be found in U.S. Pat Nos. 6,690,251; 6,639,491; 6,690,176; 6,825,818; and 6,737,930, the contents of which are hereby incorporated by reference.

Figure 4:
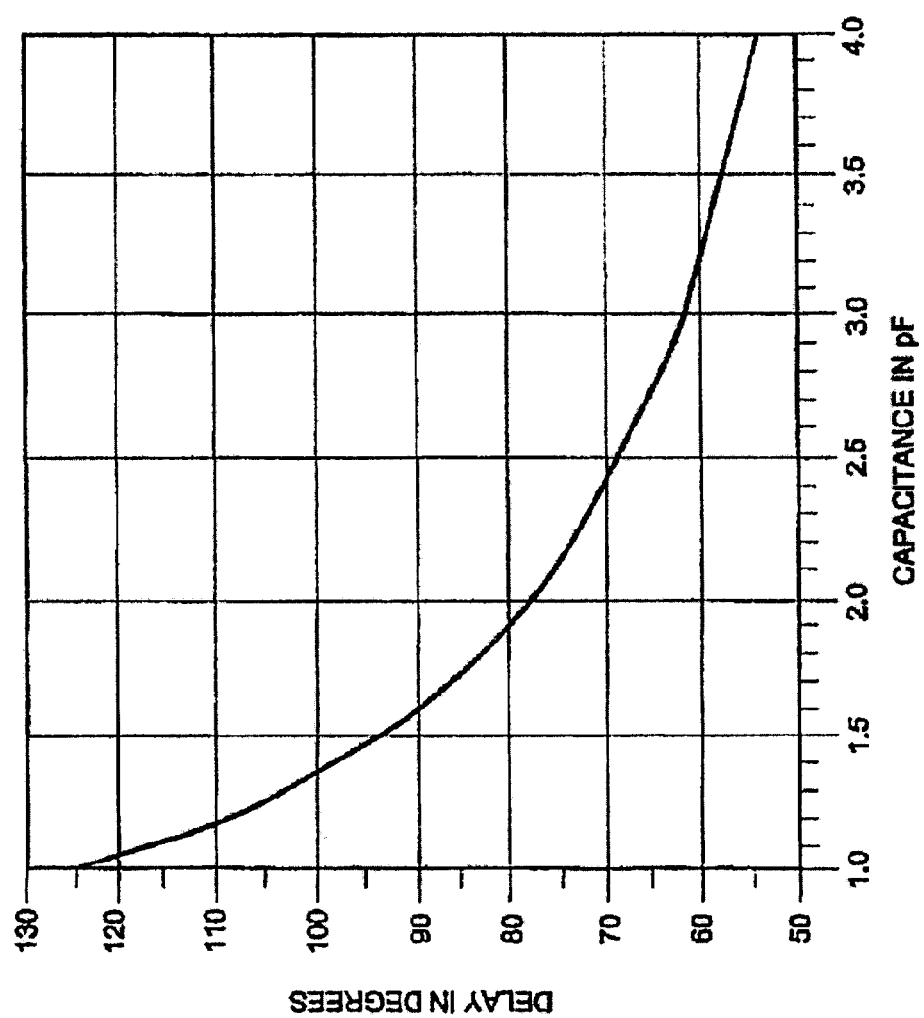
FIG. 4 illustrates the phase delay variation for the tunable filter of FIG. 3.

Regardless of how capacitors 52 and 54 are formed, the resulting phase response of filter 40 is shown in FIG. 4. This phase variation exists between an input sinusoid at 2.0 GHz entering port 42 and a phase-shifted sinusoid exiting port 44. When capacitors 52 and 54 have a capacitance of 1.0 pF, the phase delay through filter 40 is 125 degrees. Tuning capacitors 52 and 54 to a capacitance of 4.0 pF adjusts the phase delay to approximately 53 degrees. The relationship of ports 42 and 44 to LO port 24 and VCO 16 may be seen in FIG. 2. It will be appreciated that the range of phase variation necessary from tunable filter 36 will depend upon a case-by-case analysis of the DC offset present in a given receiver. Should additional phase variation be needed, filter 40 may include additional capacitors and inductors. Alternatively, a resistor-capacitor topology may be used. That is, a low pass filter made out of resistor and capacitors may be used.

Referring to FIG. 2, a control signal generator (not shown) generates a control signal for tuning the ferroelectric component or components.

A distributed architecture may also be used to form filter 36, such as a tunable transmission line whose electrical length is adjusted according to a feedback signal. For example, a ferro-electric (f-e) loaded microstrip line may be used. Such a devices and methods are described in a U.S. Pat. No. 6,825,818 which is hereby incorporated by reference.

Feedback network 38 serves to provide a negative feedback signal to tunable filter 36. In the embodiment shown in FIG. 2, feedback network 38 serves as the control signal generator. Regardless of the particular implementation of feedback network, one of ordinary skill will appreciate that fundamental principles govern the resulting stability of the negative feedback loop. In any negative feedback loop, an output is used to cancel an input. In this case, the output is the resulting phase variation from tunable filter 36 that is used to cancel the input, the DC offset detected by DC detector 32. To be stable, the transfer function must not have any root in the right half of the s-plane. The transfer function is ratio of the Laplace transform of the output and input under zero initial conditions.

Figure 5:
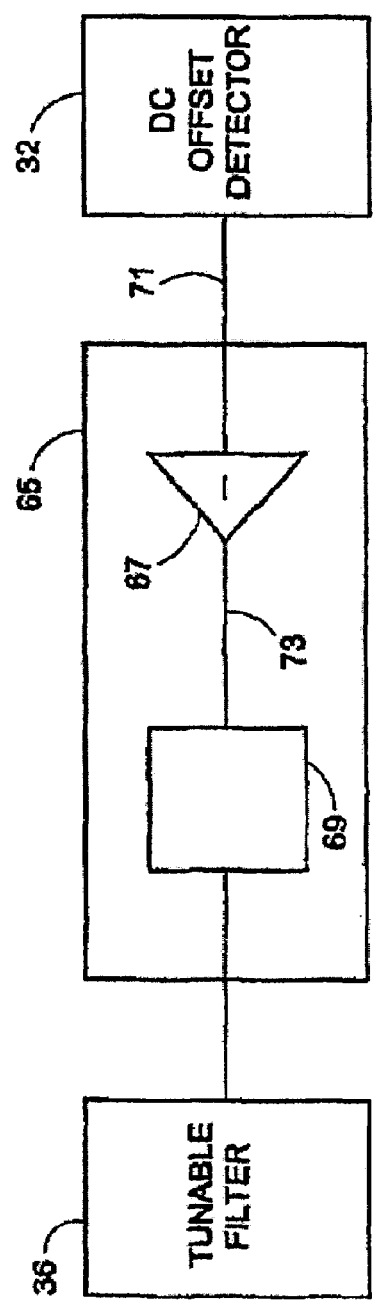
FIG. 5 illustrates a schematic diagram of a feedback network suitable for use in the direct downconversion receiver of FIG. 2.

A specific example of how the feedback network can be implemented will now be given. FIG. 5 shows a schematic diagram of a feedback network 65. The feedback network 65 contains an inverting operational amplifier 67 whose output 73 is coupled to a scaling system 69. The operational amplifier 67 receives its input 71 from the DC offset detector 32. The operational amplifier 67 inverts this input and may also amplify or attenuate it for scaling system 69.

At the output 73 to operational amplifier 67, the signal may be positive or negative. Preferably, tunable filter 36 receives a non-negative signal. Thus, scaling system 69 shifts output 73 by adding a voltage to output 73 equal to or greater than the maximum absolute value of the likely output signal 73. Scaling system 69 may also amplify output 73, after adding a voltage to it. Thus, for example, output 73 may range from −0.8 V to +0.8 V and scaling system 69 may shift it to 0.0 V to +1.6 V and then scaling it to 0.0 V to 3.3 V.

Scaling system 69 is coupled to tunable filter 36 for tuning tunable filter 36. Advantageously, tunable filter 36 varies the phase of the LO signal, responsive to the DC offset signal, thereby minimizing the DC offset of the baseband signal.

Alternatively, feedback network may be implemented as a state machine. In this case, DC offset signal is preferably a digital signal. In the interest of brevity, the functioning of state machines will not be described here.

Although the invention has been described with reference to particular embodiments, the description is only an example of the invention's application and should not be taken as a limitation. Consequently, various adaptations and combinations of features of the embodiments disclosed are within the scope of the invention as encompassed by the following claims.

We claim:

1. An electromagnetic signal phase shifter comprising:
    an input port configured to receive reference signal from a reference oscillator;
    a control signal generator configured to generate a control signal, the control signal generator responsive to a DC offset in a mixed signal;
    a tunable filter coupled to the control signal generator and to the input port, the tunable filter comprising a first impedance element and a second impedance element coupled to the first impedance element, the first impedance element comprising a first ferroelectric component, the first and second impedance elements configured to shift a phase of the reference signal; and
    an output port coupled to the tunable filter, the output port configured to transmit the phase-shifted reference signal to a mixer.

2. The electromagnetic signal phase shifter of claim 1, wherein the first ferroelectric component comprises a first ferroelectric capacitor.

3. The electromagnetic signal phase shifter of claim 2, wherein the first ferroelectric capacitor comprises a gap capacitor.

4. The electromagnetic signal phase shifter of claim 2, wherein the first ferroelectric capacitor comprises an overlay capacitor.

5. The electromagnetic signal phase shifter of claim 1, further comprising a third impedance element comprising a second ferroelectric component.

6. The electromagnetic signal phase shifter of claim 5, wherein the first and second ferroelectric components comprise first and second ferroelectric capacitors respectively.

7. The electromagnetic signal phase shifter of claim 6, wherein the first and second ferroelectric capacitors comprise respective gap capacitors.

8. The electromagnetic signal phase shifter of claim 6, wherein the first and second ferroelectric capacitors comprise respective overlay capacitors.

9. The electromagnetic signal phase shifter of claim 1, wherein the control signal generator comprises a feedback network and a DC offset detector coupled to the feedback network.

10. The electromagnetic signal phase shifter of claim 9, wherein the feedback network comprises an inverting operational amplifier coupled to a scaling system.

11. The electromagnetic signal phase shifter of claim 9, wherein the feedback network comprises a state machine.

12. A method of shifting the phase of an electromagnetic signal:
    receiving a reference signal from a reference oscillator;
    generating a control signal via a feedback network, the control signal responsive to a DC offset in a mixed signal;
    tuning a ferroelectric component in a tunable filter to shift the phase of the reference signal responsive to the control signal; and
    transmitting the phase-shifted reference signal to a mixer.

* * * * *

UNITED STATES PATENT AND TRADEMARK OFFICE
CERTIFICATE OF CORRECTION

PATENT NO. : 7,164,329 B2  Page 1 of 1
APPLICATION NO. : 10/120938
DATED : January 16, 2007
INVENTOR(S) : Stanley S. Toncich, and Raymond Curtis Wallace It is certified that error appears in the above-identified patent and that said Letters Patent is hereby corrected as shown below:

Title page,
Item (54): should read

-- (54) TUNABLE PHASE SHIFTER WITH A CONTROL SIGNAL GENERATOR RESPONSIVE TO DC OFFSET IN A MIXED SIGNAL --

Signed and Sealed this

Third Day of July, 2007

JON W. DUDAS
*Director of the United States Patent and Trademark Office*